US008570029B2

(12) United States Patent
Andres et al.

(10) Patent No.: US 8,570,029 B2

(45) Date of Patent: Oct. 29, 2013

(54) METERING APPARATUS FOR LIQUIDS AND METHOD FOR METERING LIQUIDS

(75) Inventors: Karl-Friedrich Andres, Bargteheide (DE); Peter Molitor, Henstedt-Ulzburg (DE); Peter Schmidt, Luebeck (DE)

(73) Assignee: Eppendorf AG, Hamburg (DE)

( * ) Notice: Subject to any disclaimer, the term of this patent is extended or adjusted under 35 U.S.C. 154(b) by 251 days.

(21) Appl. No.: 12/914,581

(22) Filed: Oct. 28, 2010

(65) Prior Publication Data

US 2011/0181272 A1 Jul. 28, 2011

Related U.S. Application Data

(60) Provisional application No. 61/261,884, filed on Nov. 17, 2009.

(30) Foreign Application Priority Data

Oct. 30, 2009 (DE) ........................ 10 2009 051 654

(51) Int. Cl.
*H01L 43/06* (2006.01)
*B01L 3/02* (2006.01)

(52) U.S. Cl.
USPC .................. 324/207.2; 73/864.16; 73/864.11

(58) Field of Classification Search
USPC ...................... 324/207.2; 73/864.16; 422/501
See application file for complete search history.

(56) References Cited

U.S. PATENT DOCUMENTS

| | | | | |
|---|---|---|---|---|
| 5,002,737 | A * | 3/1991 | Tervamaki | 422/511 |
| 5,187,990 | A | 2/1993 | Magnussen, Jr. et al. | |
| 5,620,660 | A | 4/1997 | Belgardt et al. | |
| 5,892,161 | A * | 4/1999 | Conley et al. | 73/864.18 |
| 6,254,832 | B1 | 7/2001 | Rainin et al. | |
| 6,532,837 | B1 * | 3/2003 | Magussen et al. | 73/864.14 |
| 6,778,917 | B1 | 8/2004 | Jansen | |
| 6,968,749 | B2 | 11/2005 | Chen et al. | |
| 7,175,813 | B2 | 2/2007 | Petrek et al. | |
| 7,434,484 | B2 | 10/2008 | Belgardt | |
| 7,540,205 | B2 * | 6/2009 | Nelson et al. | 73/864.11 |
| 8,088,342 | B2 * | 1/2012 | Cote et al. | 422/516 |
| 2005/0118069 | A1 * | 6/2005 | Solotareff et al. | 422/100 |
| 2005/0124059 | A1 | 6/2005 | Kureshy et al. | |
| 2007/0276546 | A1 | 11/2007 | Molitor | |
| 2008/0006100 | A1 | 1/2008 | Wilmer | |
| 2008/0011042 | A1 | 1/2008 | Molitor et al. | |
| 2009/0000350 | A1 | 1/2009 | Magnussen et al. | |
| 2009/0000402 | A1 | 1/2009 | Magnussen et al. | |
| 2009/0000403 | A1 | 1/2009 | Magnussen et al. | |
| 2009/0071266 | A1 | 3/2009 | Nelson et al. | |
| 2009/0221059 | A1 * | 9/2009 | Williams et al. | 435/287.2 |

FOREIGN PATENT DOCUMENTS

| | | | |
|---|---|---|---|
| DE | 298 24 951 | U1 | 11/2003 |
| DE | 102 57 414 | A1 | 6/2004 |
| DE | 10 2004 025 588 | A1 | 12/2005 |
| EP | 0 801 309 | A2 | 10/1997 |
| WO | 86/02161 | | 4/1986 |

* cited by examiner

*Primary Examiner* — Arleen M Vazquez
*Assistant Examiner* — Hoang X Nguyen
(74) *Attorney, Agent, or Firm* — Vidas, Arrett & Steinkraus

(57) ABSTRACT

A metering apparatus for liquids and a method for metering liquids which facilitate the operation of a further metering after detaching the pipette point or syringe.

14 Claims, 7 Drawing Sheets

METERING APPARATUS FOR LIQUIDS AND METHOD FOR METERING LIQUIDS

CROSS-REFERENCE TO RELATED APPLICATIONS

Not applicable

STATEMENT REGARDING FEDERALLY SPONSORED RESEARCH

Not applicable

BACKGROUND OF THE INVENTION

The present invention is related to a metering apparatus for liquids with means for holding a pipette point or syringe and with means for detaching the pipette point or syringe and an electric drive motor for moving a displacement member of a displacement device for aspirating or ejecting air into or from out a pipette point, or for moving coupling means adapted to be coupled with a syringe piston of the syringe. The means for detaching the pipette point or syringe are actuated separately in this, without that the displacement member or the syringe piston and the coupling means coupled therewith are moved. The invention relates further to a method for metering liquids using such a metering apparatus.

Metering apparatuses are mainly used in the laboratory for metering liquids. The liquid amounts to be metered are particularly located in the range of 100 nl up to several 100 ml. Metering apparatuses by which liquids are taken up in one single step and given off in one single step are designated as pipettes. Metering apparatuses by which liquids are taken up in one single or several steps and given off in plural steps are designated as dispensers.

The liquids are taken up in pipette points or syringes and given off from that. Pipette points are small pipes with an opening at the lower end and an opening at the upper end. The lower opening is mostly smaller than the upper opening is. Syringes have a syringe cylinder and a syringe piston, disposed movably in the syringe cylinder by shifting in the direction of the cylinder axis. Further, the syringe cylinder has a syringe opening in the syringe bottom, that is often disposed in a small pipe which projects from the syringe bottom.

When metering, the pipette point is held on the metering apparatus such that the upper opening is in communicating connection with a displacement device of the metering apparatus. The displacement device is mostly a cylinder with a piston that is shiftable therein. By moving the piston, an air cushion is moved, so that liquid is aspirated through the lower opening into the pipette point or is ejected from the same.

The syringe is held on the metering apparatus such that the syringe cylinder is stationary with respect to the metering apparatus, and the syringe piston is mechanically coupled to coupling means of the metering apparatus. By dislocating the coupling means, the syringe piston can be shifted in the syringe cylinder in order to aspirate liquid into the syringe cylinder and to eject it out of the same.

In order to move the displacement member or the coupling means, known metering apparatuses feature a manually driven drive mechanism or an electric drive motor. A metering apparatus with an electric drive motor is controlled by means of electric control means and it has an electric power supply connected to the electric drive motor and the electric control means (for instance an accumulator, a battery or a mains supply device). In addition, the electric control means are electrically connected to input means. Via the input means, metering steps (for instance to take up and to give off liquid) can be controlled, and/or the amounts of liquid to be taken up and to be given off can be selected and/or modes of operation (for instance pipetting or dispensing) can be selected. The input means can be electric touch-buttons or switches in particular. Further, metering apparatuses with an electric drive motor have often a display device (a LCD display for instance) in order to output information regarding the operating condition of the metering apparatus and/or the progress of a metering procedure and/or selected metering amounts and/or a selected mode of operation.

The means for holding the pipette point are mostly realised as a clamping seat (for instance as pin-up lug or blind hole). A passage opening in the front side of the pin-up lug or in the bottom of the blind hole, respectively, is communicatingly connected to the displacement chamber of the displacement device.

The means for holding the syringe are for instance cylinder gripping levers, which are associated to a cylinder accommodation in a casing of the metering apparatus in order to hold a flange on the syringe cylinder in the cylinder accommodation. Further, the means for holding can comprise piston gripping levers in a coupling dome, into which an end of the syringe piston or of a syringe piston rod is insertable in order to couple the same with the coupling dome.

Pipette points and syringes are detachably connected to the metering apparatus, so that they can be replaced by new pipette points or syringes after use. Thereby contaminations at subsequent meterings can be avoided. Pipette points or syringes for single use are available at low cost from plastic material.

The means for detaching a pipette point often comprise a throw-off slider having one end that is associated to the pin-up lug or the blind hole. The other end of the throw-off slider features an actuation button. A pipette point can be pushed off from the pin-up lug or be pushed out of the blind hole by displacing the throw-off slider.

In this, the means for detaching the pipette point or syringe is preferably arranged laterally on the outside of the base body and is not in connection with the displacement member of the displacement device, mostly the cylinder, or the movable coupling means of the metering apparatus in case that syringes are used.

In order to detach the syringe, the gripping levers may be pivotal towards the outside. For this purpose, the cylinder gripping levers can be provided with actuation ends that are manually actuable from the outside and have contact sites on the inner side which co-operate with actuation ends of the piston gripping levers, so that the piston gripping levers are moved upon actuation of the cylinder gripping levers when the syringe cylinder is completely thrust into the syringe piston. The means for detaching a syringe can also feature a mechanism which can be actuated by way of one single actuation button and acts on the cylinder gripping levers and the piston gripping levers. In particular, the means for detaching the syringe may bring about a detachment of the syringe from the metering apparatus, irrespective of the position of the syringe piston in the syringe cylinder.

In the metering apparatus with electric drive motor, detachment of a pipette point does not have any effects on the positioning of the piston in the cylinder of the displacement device. If the throw-off of the pipette point takes place for instance when the piston is in an upper position after the suction stroke, the piston must be dislocated into a base position by additional actuation steps, starting from which a completely new metering process can be initiated again. If a metering apparatus having an electric drive motor is laid aside after detaching the pipette point, the piston being in its upper position, and is thereafter used by another person, difficulties may arise when this person does not recognise that the piston must first be brought into a lower position for the metering in order to take up liquid by the metering apparatus.

Generally, for the user of a metering apparatus with controllable drive, an electric one in particular, it is not obvious in which position the actuation member or the coupling means is when he/she has thrown off the pipette point or syringe from the metering apparatus.

In a metering apparatus, there is also the situation in which the user wants to throw off a pipette point or syringe even though a liquid taken up or particles taken up together with the liquid, like magnetic beads, are at least partly still present in the pipette point or syringe. In this case, the displacement member or the coupling means, respectively, is not moved down up to the bottom, and the pipette point or syringe, respectively, is thrown off in spite of this by the means for detaching the pipette point or syringe, respectively, that is separate from the displacement device or the coupling means. As the position of the displacement member or of the coupling means, respectively, is not known for the next user of the metering apparatus in this situation, in particular when this user is another one than that one which has used the metering apparatus before, he/she does not known after putting up a new pipette point or syringe whether he/she has to move the displacement member or the coupling means downward at first in order to take up liquid by the metering apparatus, or whether the displacement member or the coupling means are already in the bottom position.

Similar problems may arise when a syringe is detached in a metering apparatus with electric drive motor before the syringe piston and with it the coupling means had been brought into its lower position.

The document U.S. Pat. No. 6,968,749 B2, the entire contents of this is incorporated herein by reference, discloses a portable automatic pipette with a throw-off device for pipette points. A sensor detects whether a pipette point has been removed. When the sensor detects the removal of a pipette point, a micro-processor controls the output of an alarm signal, in order to give notice to the user that an erroneous operation had occurred. The user has to set the pipette into the starting condition anew for a new metering process.

The solutions mentioned in the following from the following documents can also be applied to the metering apparatus and the process of the present invention. The description relevant to this is incorporated by reference into the following application.

From U.S. Pat. No. 5,187,990, the entire contents of this is incorporated herein by reference, a metering apparatus for pipette points having an electric drive and a throw-off device for pipette points is known. From this document, electric control means for controlling the dislocation of the piston of the displacement device and a method for metering liquids are also known, in which the piston is dislocated in a special manner.

U.S. Pat. No. 6,778,917 B1, the entire contents of this is incorporated herein by reference, US 2007/0276546 A1, the entire contents of this is incorporated herein by reference, and US 2008/0011042 A1, the entire contents of this is incorporated herein by reference, disclose apparatuses with electric control means, input means and display means. Special control—as well as input—and display methods are also known from these documents.

U.S. Pat. No. 7,434,448 B2, the entire contents of this is incorporated herein by reference, describes a metering apparatus with a throw-off device for pipette points. From this document, it is also known that the casing of the pipette features a casing upper part with a mechanical drive mechanism and a casing lower part detachably connectable therewith and having a displacement device. A disc on a piston rod of the piston is pressed against the end of a driving rod of the drive mechanism under spring pre-stress.

From US 2008/006100 A1, the entire contents of this is incorporated herein by reference, a metering apparatus with a casing upper part and a casing lower part and a coupling between the piston and the drive mechanism is known, the coupling comprising an elastic element.

U.S. Pat. No. 5,620,660, the entire contents of this is incorporated herein by reference, describes a metering apparatus with cylinder gripping levers and piston gripping levers for detachably holding syringes.

BRIEF SUMMARY OF THE INVENTION

Starting from this, the present invention is based on the objective to provide a metering apparatus for liquids and a method for metering liquids which facilitate the operation of a further metering after detaching the pipette point or syringe.

The metering apparatus for liquids has a base body, means disposed on the base body for holding at least one pipette point in sealing connection with its upper opening to a passage opening on the base body, and a displacement device disposed in the base body having a displacement chamber, a displacement member movably disposed therein, and a communicating connection to the passage opening, or means disposed on the base body for holding at least one syringe with a syringe cylinder in stationary relation to the base body, and with a syringe piston shiftable in the syringe cylinder and a coupling means adapted to be mechanically coupled to the syringe piston in the base body, means disposed on the base body for detaching the pipette point or syringe from the means for holding, with a manually actuable actuation member for actuating the means for detaching without that the displacement member or the coupling means are moved, a sensor disposed on the base body for detecting an actuation of the means for detaching or of an occurred detachment of the pipette point or syringe, a controllable drive, which is operably connected to the displacement member or the coupling means, input means for controlling the controllable drive, electric control means, electrically connected to the controllable drive, the input means and the sensor being made such that the controllable drive dislocates the displacement member or the coupling means into a base position when the sensor detects an actuation of the means for detaching or the accomplished detachment of the pipette point or syringe.

Preferably, a dislocation of the displacement member or of the coupling means for taking up liquid into a pipette point or syringe takes place from out the base position.

The controllable drive is preferably an electric drive, an electric drive motor in particular.

The metering apparatus of the present invention has a base body, which is a supporting structure for further components of the metering apparatus. The base body is for instance a casing. Means for holding at least one pipette point or syringe are present on the base body. As a consequence of this, the metering apparatus can be realised as a one-channel or as a multichannel metering apparatus. The means for holding at least one pipette point can be a pin-up lug or a blind hole. The means for holding at least one syringe can comprise cylinder gripping levers and piston gripping levers.

The means for holding at least one pipette point exist in combination with a displacement device having a displacement chamber and a displacement member. The means for holding at least one syringe comprise coupling means that can be coupled mechanically with the syringe piston. The coupling means can be a coupling dome with piston gripping levers in particular.

Further, there are means for detaching the pipette point or syringe. These are separated from the displacement device and the coupling means. The means for detaching a pipette point are preferably realised as a throw-off slider, which is made and disposed such that it pushes off a pipette point from a clamping seat when the actuation member connected to the throw-off slider is actuated. The means for detaching a syringe have for instance a mechanism which is in operable connection with cylinder gripping levers and piston gripping levers.

The actuation of the means for detaching is detected by a sensor which is disposed on the base body. Electric control means control the controllable drive such that the displacement member or the coupling means are dislocated into a base position when the sensor detects an actuation of the means for detaching. In this, the base position can be arbitrarily selected on the path over which the base position or the coupling means can be moved in the metering apparatus. The base position is preferably that position from out which a dislocation of the displacement member or the coupling means towards the upside always occurs when it is intended to take up liquid into a new pipette point or syringe. The sensor detects that the means for detaching have been actuated. Through this, it is recognised indirectly that no more pipette point or syringe is held on the metering apparatus. The signal of the sensor is utilised by the control means in order to move the displacement member or the coupling means into the base position. As a consequence, the metering apparatus is in this embodiment immediately after the detachment of the pipette point or syringe ready again to take up liquid into a new pipette point or syringe.

However, the base position might for instance also be on the topside, so that the displacement member or the coupling means must first be moved downward before each take-up of a liquid. This can take place either automatically, when the user gives a command to the metering apparatus by way of the input means to take up liquid. Or, on the other hand, before taking up a liquid, the user can also be required to give a command to the metering apparatus to move the displacement device or the coupling means downward.

Through this, the operation of the metering apparatus is facilitated for the user. In particular, the user is protected against erroneous filling of the pipette point or syringe and other errors.

Alternatively, the sensor disposed on the base body may also detect the occurred detachment of a pipette point or syringe, for instance by determining that the sealed connection between the pipette point and the means for holding disposed on the base body no longer exist.

For instance, the sensor may be a switch that is actuated by the means for detaching when the displacement member is actuated. In particular, it may be a switch which is disposed in the dislocation region of the actuation member. According to a further embodiment, the sensor is a reed contact, adapted to be actuated by dislocation of a magnet disposed on the means for detaching. The magnet is preferably a permanent magnet. According to a further embodiment, the magnet is disposed on the actuation member. According to a further embodiment, the reed contact is disposed on a circuit board in the base body. The circuit board may be a circuit board in particular that comprises the electric control means or a part thereof.

As a sensor, each other sensor can be generally used which detects the movement of the actuation member or of the means for detaching the pipette point or syringe. In this, the actuation of the means for detaching is detected by the sensor in a position of the actuation member or the means for detaching in which it is made sure that the pipette point or syringe has been thrown off.

According to one embodiment, the sensor responds to an actuation of the means for detaching when the dislocation path of the actuation member corresponds to at least that dislocation path of the actuation member which must be traveled for detaching the pipette point or syringe from the means for holding. According to a further embodiment, the dislocation path for actuating the sensor is 3.6 to 4.5 mm, preferably 4 mm, and the dislocation path for detaching the pipette point or syringe is 2.5 mm to 3.5 mm, preferably 3.1 mm.

According to a further embodiment, the means for holding feature at least one clamping seat for a pipette point, and the means for detaching a throw-off slider adapted to be dislocated with respect to the clamping seat and having one end for pushing off a pipette point from the clamping seat, the actuation member being connected to the other end of the throw-off slider.

According to a further embodiment, the displacement chamber is a cylinder and the displacement member is a piston, disposed movably within in the cylinder.

According to a further embodiment, the control means are made such that they dislocate the displacement member into a home position when the sensor detects an actuation of the means for detaching, from which home position the degree of a further dislocation of the displacement member is determined, and that they dislocate the displacement member into the base position after the arrival in the home position.

The home position serves for setting the metering apparatus into a defined starting position. The dislocations of the displacement member are determined from out the home position. Through this it is achieved that the degree of dislocation of the displacement member, and by this the metering accuracy, can be controlled very accurately. This is an advantage in particular when the electric drive motor is a DC motor, whose rotations are captured by a rotational angle transmitter. Experience has shown that some counting pulses can be lost in this, through which the accuracy of the dislocation of the displacement member is compromised in the course of time. By positioning the displacement member into a home position, the metering apparatus is set into defined starting position, which is the starting point for a further dislocation of the displacement member. Counting errors occurred in the meantime are eliminated through this. This embodiment might also make sense in other realisations of the electric drive motor, for instance when it is realised as a stepping motor.

According to a preferred embodiment, the control means are made such that when the metering apparatus is switched on, they control a movement of the displacement member into the home position and thereafter into the base position. Through this, it is made sure in each starting of the metering apparatus that the dislocation of the displacement member takes place from out a defined starting position.

Alternatively, even the home position can already be the base position into which the displacement member or the coupling means are dislocated.

The home position can be realised for instance in that the displacement member or a drive mechanism connected therewith hits an abutment. This can lead to blocking in the drive system, to increased power consumption and to materials damage. According to a preferred embodiment, a further sensor disposed in the base body and electrically connected to the control means detects the arrival of the displacement member in the home position. The disadvantages of a home position defined by an abutment described above are overcome by this. According to a further embodiment, the further sensor is a Hall sensor, which is actuated by a further magnet connected to the displacement member, when the displacement member arrives in the home position. The further magnet may also be indirectly connected with the displacement member, for instance by being fixed on a drive mechanism which drives the displacement member.

According to one embodiment, the home position is 1 to 8 mm away from the base position, preferably 4 mm.

According to one embodiment, the control means are made such that starting from the base position, they control a suction stroke of the displacement member, thereafter at least one blow out stroke up to the arrival of the displacement member in the base position, and thereafter an overblow stroke up to the arrival in an overblow position. The overblow position functions to remove residual liquid amounts from the pipette point. The overblow position is preferably disposed between the base position and the home position. For instance, it has a distance of 1.0 to 3.9 mm from the base position, 3 mm in particular. In that the overblow position is at a distance from the home position, the displacement member can be dislocated into the overblow position very rapidly in order to blow out liquid from the pipette point. Further, the displacement member can be dislocated into the home position very slowly and accurately through this. However, in principle it is also possible that overblow position and home position coincide.

In the metering apparatus that has means for holding at least one syringe, a defined starting position is given in that the syringe piston hits the bottom of the syringe cylinder. This hitting is also desired in order to avoid an air cushion between syringe piston and liquid. As a consequence, in this type of the metering apparatus it can be omitted to dislocate the coupling means, and through this the syringe piston, into a home position. Thus, in this type of the metering apparatus the metering processes take place preferably starting from a base position, in which the syringe piston sits on the bottom of the syringe cylinder.

The metering apparatus is preferably a handheld metering apparatus. In the handheld metering apparatus, the casing is preferably realised as a handle. However, the metering apparatus can also be realised as a stationary metering apparatus. It is also possible to realise the metering apparatus such that it can be used as a handheld metering apparatus and as a stationary metering apparatus.

The objective is further achieved by a method with the features of claim 12. Advantageous embodiments of the method are indicated in subclaims.

In the method of the present invention for metering liquids by means of a metering apparatus having means for holding at least one pipette point and a displacement device with a displacement chamber and a displacement member disposed movably therein, or with means for holding a syringe with a syringe cylinder and a syringe piston movable therein and coupling means adapted to be coupled to the syringe piston, as well as with a controllable drive operably connected to the displacement member or the coupling means and with means for detaching the pipette point or syringe from the means for holding, an actuation of the means for detaching or the occurred detachment of the pipette point or syringe is detected, and the displacement member or the coupling means is dislocated into a home position after an actuation of the means for detaching.

Starting from the base position, the displacement member or the coupling means is then preferably dislocated in order to take up liquid into the pipette point or the syringe.

The advantageous effects described for the metering apparatus hold even for this method.

According to one embodiment of the method, the displacement member is first dislocated into a home position, and thereafter into a base position. As already described, this embodiment functions to perform the metering processes from out a fixed starting point. According to a further embodiment, for this purpose the displacement member is at first dislocated into the home position when the metering apparatus is switched on, and thereafter into the base position.

Finally, according to one embodiment the displacement member is dislocated about at least one suction stroke from out the base position in order to take up liquid into the pipette point, thereafter about at least one blow-out stroke up to the arrival in the base position, and thereafter about an overblow stroke up to the arrival in the overblow position.

BRIEF DESCRIPTION OF THE SEVERAL VIEWS OF THE DRAWINGS

In the following, the present invention is explained in more detail by means of the attached examples of its realisation. In the drawings show.

DETAILED DESCRIPTION OF THE INVENTION

Figure 1A:
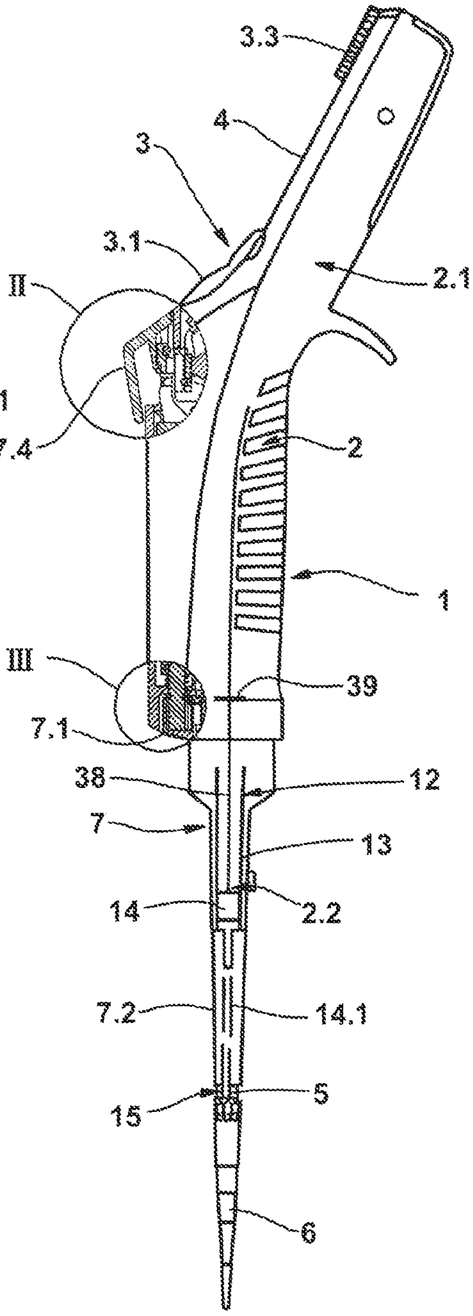
FIG. 1*a* a metering apparatus with pinned-up pipette point in the working position, being vertically cut in the region of the actuation member and in the region of the connection of two portions of the throw-off device.

While this invention may be embodied in many different forms, there are described in detail herein a specific preferred embodiment of the invention. This description is an exemplification of the principles of the invention and is not intended to limit the invention to the particular embodiment illustrated.

In the present application, the designations “up”, “down”, “horizontally” and “vertically” relate to that orientation of the metering apparatus that is shown in the depictions. According to the drawings, a pipette point held on the metering apparatus is disposed with its lower opening down, in order to take up liquid from a vessel situated below the metering apparatus, or to give it off into such a vessel, respectively.

The metering apparatus 1 has a longitudinal casing 2 shaped as a handle, with a casing upper part 2.1 and a casing lower part 2.2. The casing upper part features input means 3 in the form of a switch rocker 3.1 and two keys 3.2, 3.3 and an operation mode rotary switch 3.3. Further, a display device 4 in the form of a LCD display is disposed on the casing upper part 2.1.

The casing lower part 2.2 has a conical clamping seat 5 at the lower end, in order to pin up a pipette point 6.

Further, the metering apparatus has means 7 for detaching the pipette point 6 from the clamping seat. These means for detaching 7 comprise a throw-off slider 7.1, which has a sleeve-shaped slider part 7.2 that is disposed on the casing lower part 2.2 and can be dislocated downward from out an upper contact position on the casing upper part 2.1. The throw-off slider 7.1 comprises a rod portion 7.3, which is guided in a vertical guiding channel in the casing upper part 2.1. At the upper end, the rod portion 7.3 is coupled to an actuation member 7.4 in the form of an actuation button that can be actuated from the outside. Against the action of a pull-back spring 8, which is supported on a projection on the rod portion 7.3 at its topside and is supported at the downside on the topside of a casing-stationary abutment 9, the throw-off slider 7.1 can be dislocated downward by pushing the actuation member 7.4. The movement of the throw-off slider 7.1 towards the upside is limited by an O-ring 10, which is partially inserted into a an annular groove 11 at the lower end of the rod portion 7.3, and contacts the abutment 9 at the lower side thereof in its uppermost position.

A displacement device 12 with a displacement chamber 13 in the form of a cylinder and a displacement member 14 in the form of a piston disposed movably therein is disposed in the casing lower part 2.2. The displacement chamber 13 is communicatingly connected to a passage opening 15 in the lower front surface of the clamping seat 5 via a passage channel 14.1. The features mentioned above of the casing lower part 2.2 are shown in FIG. 1*a*.

Figure 1B:
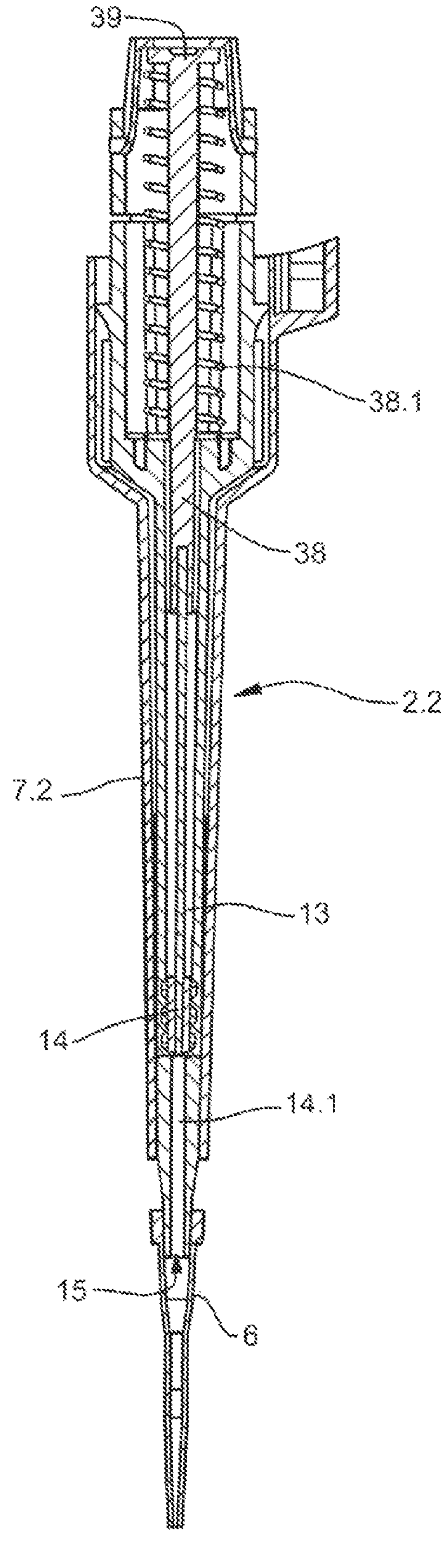
FIG. 1*b* a possible embodiment of the casing lower part of the metering apparatus of FIG. 1*a;*
Figure 5:
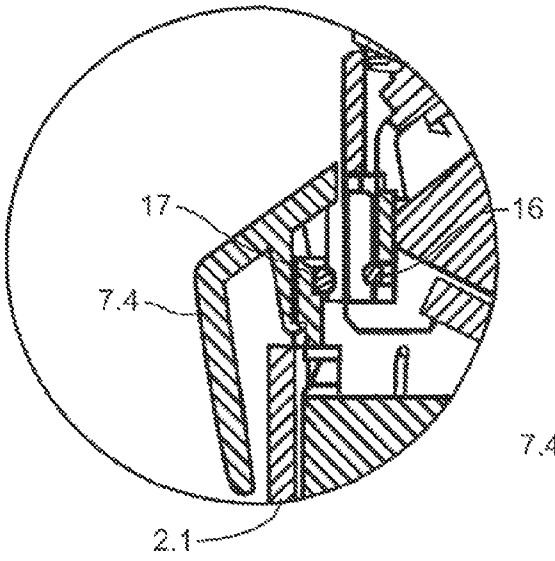
FIG. 5 magnified section V of FIG. 4.
Figure 4:
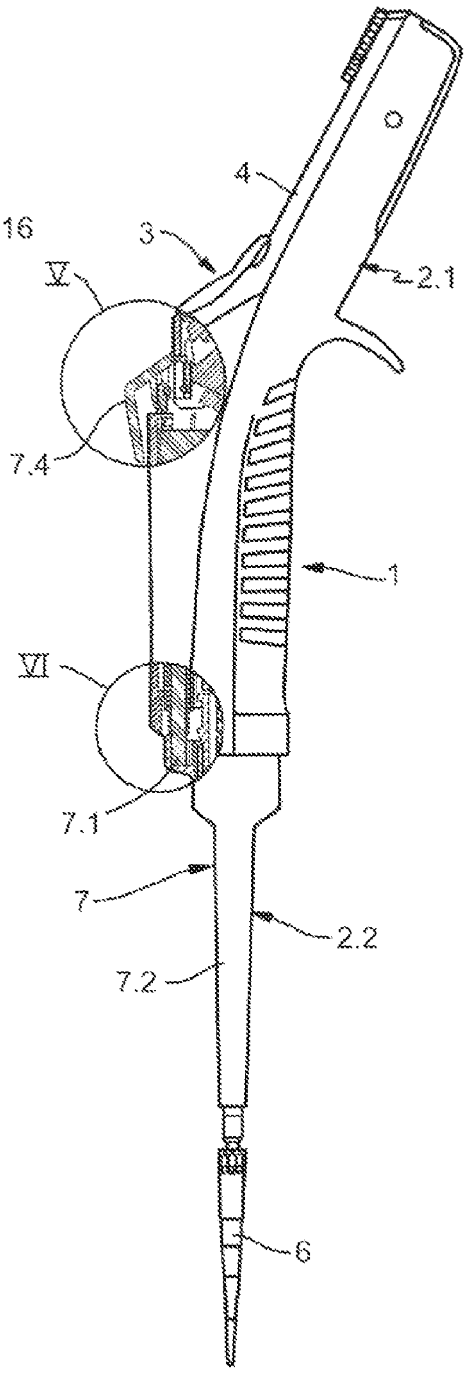
FIG. 4 the same metering apparatus with the throw-off device in throw-off position in a side view, wherein the throw-off device is vertically cut at the same sites as in FIG. 1.
Figure 6:
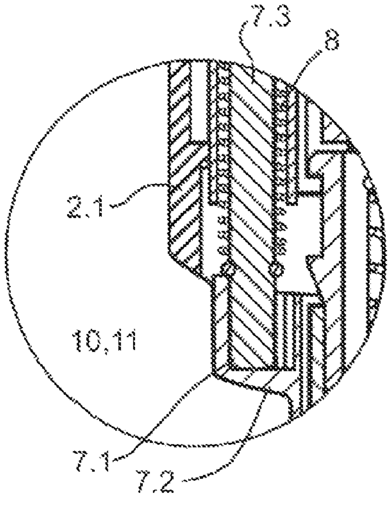
FIG. 6 magnified section VI of FIG. 4.

FIG. 1*b* shows in detail a realisation of the casing lower part 2.2 that can be used in the metering apparatus 1. The reference numerals mentioned above are drawn in into FIG. 1*b*. The casing lower part 2.2 is described in the German patent application DE 10 2008 048 252.8 and the U.S. provisional 61/097393. The description relating to this is incorporated by reference into the present application.

A sensor 16 in the form of a reed contact is fixed in the casing 2. A magnet 17 is associated to the reed contact, which is realised as a cylindrical permanent magnet and fixed on the upper end of the rod portion 7.3 of the throw-off slider 7.1.

The sensor 16 sits on the lower circuit board portion 18.1 of a circuit board 18, which has three circuit board portions that are in an angle to each other. On the central circuit board portion 18.2, it bears components of electric control means 19, which are made in semiconductor technology. Further arranged there are the switch rocker 3.1 and the keys 3.2, 3.3. The upper circuit board portion 18.3 bears the display device 4 and the rotational switch 3.3 for the operation mode. The reed contact is wired with the electric control means 19.

An electric drive motor 20 is disposed in the casing upper part 2.1. The drive motor 20 is a DC motor. The drive motor 20 is disposed vertically with the shaft 21 on the lower end. The shaft 21 bears a drive pinion 22. Below the drive pinion 22, the shaft 21 bears a rotational angle transmitter magnet 24 in a dome-shaped mounting 23. This magnet is a permanent magnet which is realised as a bar magnet.

Below the rotational angle transmitter magnet 24, a rotational angle transmitter 25 realised as an IC is disposed on a further circuit board.

The rotational angle transmitter 25 is wired with electric control means 19. A vertically oriented screw bar 26 is disposed in the casing upper part 2.1 next to the drive motor 20. The screw bar 26 extends through a screw bar nut 27, which has a toothed wheel 28 on its outside. The screw bar nut 27 is bearing mounted on both sides in ball bearings 29.1, 29.2.

The screw bar 26 features a radial projection 30 at its topside, which is guided in an axially extending groove 31 of a guiding 32 that is parallel to the screw bar 26 and stationary with respect to the casing. Thus, the projection 30 forms a rotation protection of the screw bar 26.

A toothed belt 33 is guided over the drive pinion 22 and the toothed wheel 28. When the shaft 21 of the drive motor 20 rotates, the screw bar nut 27 is driven via the drive pinion 22 and the toothed belt 33. As a consequence, the screw bar 26 is screwed within the screw bar nut 27. As the screw bar 26 is prevented from rotation through the engagement of the projection 30 into the groove 31, the screw bar 26 is dislocated towards the upside or the downside in this, depending on the rotational sense of the shaft 21.

Further, another magnet 34 is positioned at the topside in the screw bar 26, next to the projection 30. This magnet is also a permanent magnet, which is realised as a bar magnet.

A Hall sensor 36 is disposed next to the screw bar 26 in the casing upper part 2.1 on a further circuit board 35. The Hall sensor 36 is also connected to the electric control means 19. The screw bar 26 is adjustable such that the further magnet 34 arrives in the influence range of the Hall sensor 36.

The screw bar 26 bears a magnet disc 37 on its lower end. The displacement chamber 14 bears a piston rod 38 on the upside, which bears a further magnet disc 39 on its upper end. The magnet discs 37, 39 of the screw bar 26 and the piston rod 38 have different poles on the sides that face each other, so that they adhere to each other when they are brought into contact. For this purpose, the further magnet disc 38 can be pushed upward up to an upper abutment 38.2 by a spring 38.1 that is disposed in the casing lower part 2.2. The magnet disc 37 contacts the magnet disc 39 through a hole 38.3 in the abutment 38.2.

Figure 12B:
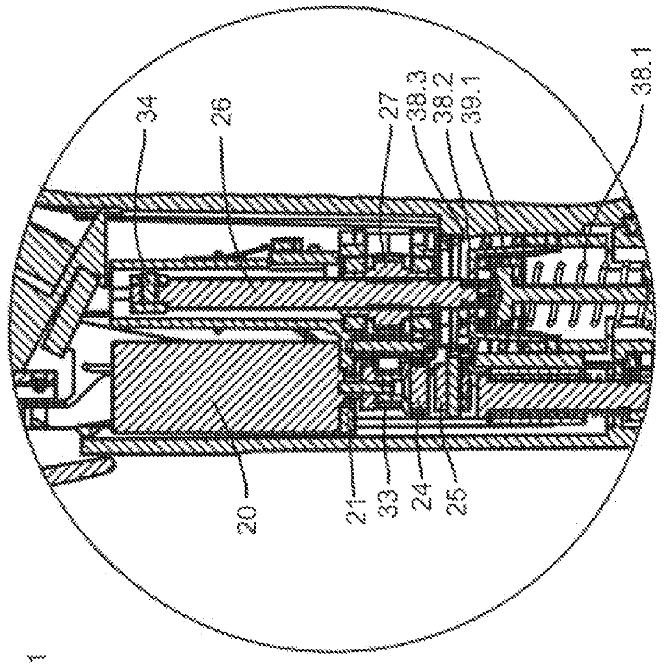
FIG. 12*b* a section corresponding to FIG. 12*a* of an alternative embodiment of the metering apparatus.

Instead of the above, in the alternative of FIG. 12*b*, the piston rod 38 bears a curved washer on the upper end, which is pushed upward up to an upper abutment 38.2 by a spring 38.1 that is disposed in the casing lower part 2.2. The lower front side of the screw bar 26 can contact the curved washer 39.1 through a hole 38.3 in the abutment 38.2, so that the screw bar 26 can dislocate the piston rod 38 and with that the piston downward against the action of the spring. When the screw bar 26 is dislocated upward, the piston rod 38 and with that the piston is pushed back towards the upside by the spring.

Figure 2:
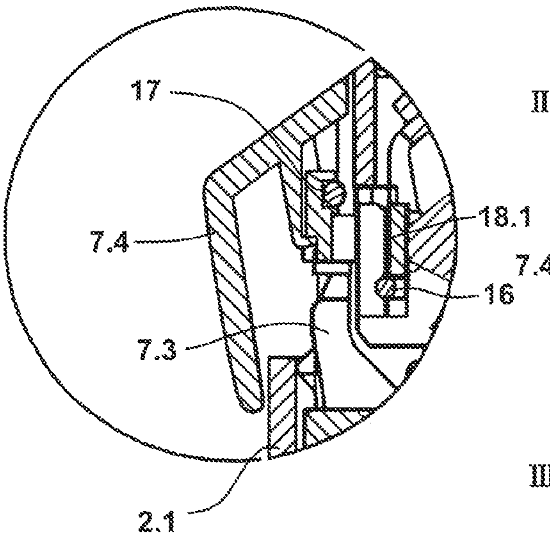
FIG. 2 a magnified section II of FIG. 1*a;*
Figure 3:
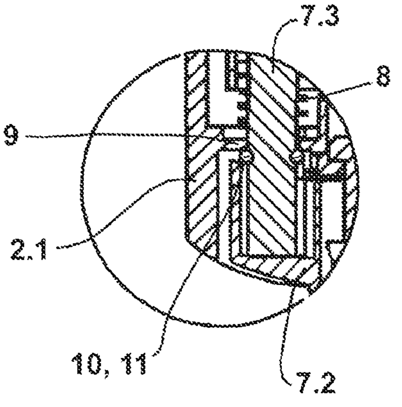
FIG. 3 magnified section III of FIG. 1*a;*

According to FIGS. 1 to 3, a pipette point 6 is pinned up on the clamping seat 5, and the throw-off slider 7.1 is not actuated. In this configuration, the metering apparatus 1 is ready for a metering process.

Figure 7:
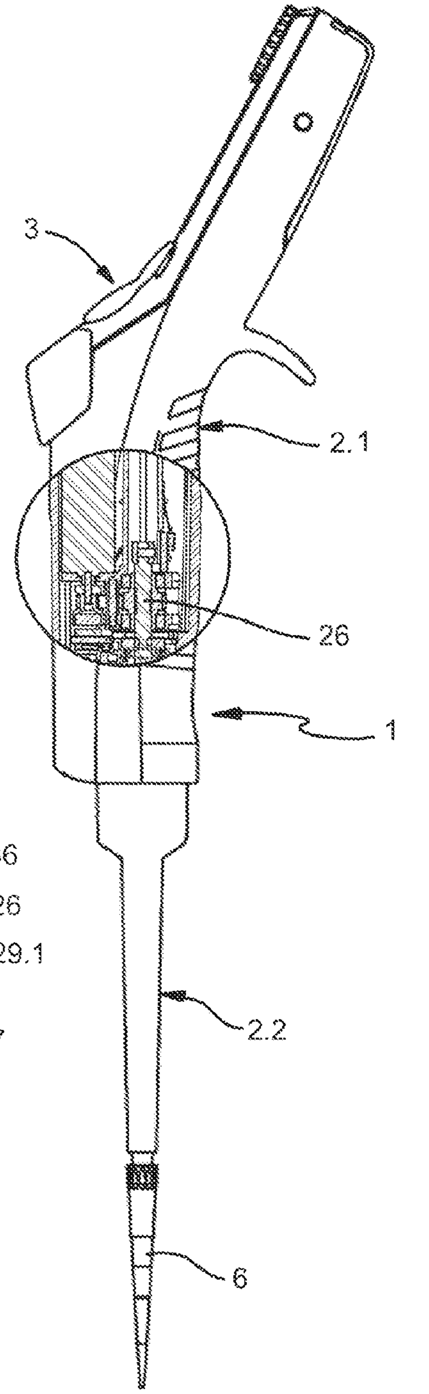
FIG. 7 the same metering apparatus with the drive in home position in a side view, wherein it is vertically cut in the region of the drive.
Figure 8:
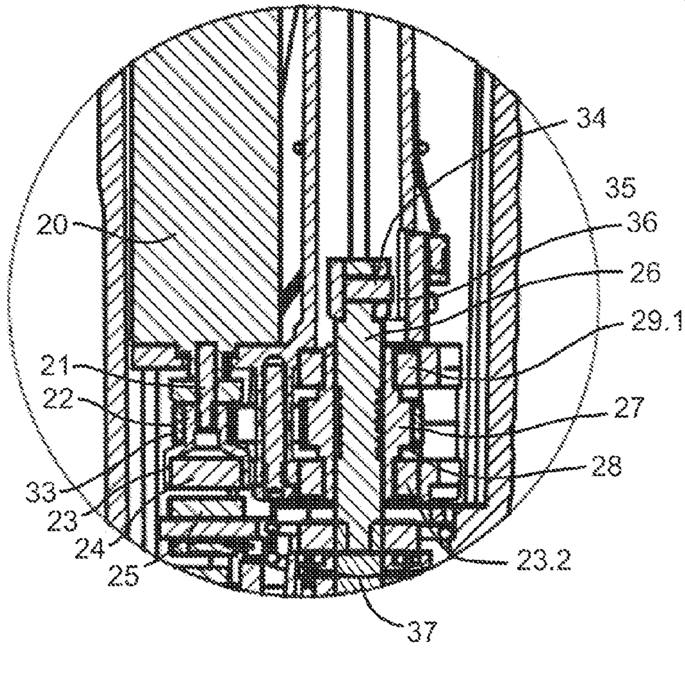
FIG. 8 magnified section VIII of FIG. 7.

According to FIGS. 7 and 8, the screw bar 26 is in a home position, in which the further magnet 34 is associated to the Hall sensor 36. The electric control means 19 control the drive motor 20 such that the screw bar 26 is brought into this position when the metering apparatus is switched on by actuating a not shown on/out switch.

The impulses of the rotational angle transmitter 25 are counted by the electric control means 19, starting from the starting position in the home position. Thus, the dislocation of the screw bar 26 is related to the home position.

After the arrival in the home position, the electric control means 19 controls the drive motor 20 automatically, such that the screw bar 26 is dislocated into a base position which is somewhat above the home position. From out the base position, metering processes are started in all the modes of operation, for instance pipetting and dispensing. In the example, the base position is 4 mm above the home position. This is shown in the FIGS. 9 and 10.

Figure 11:
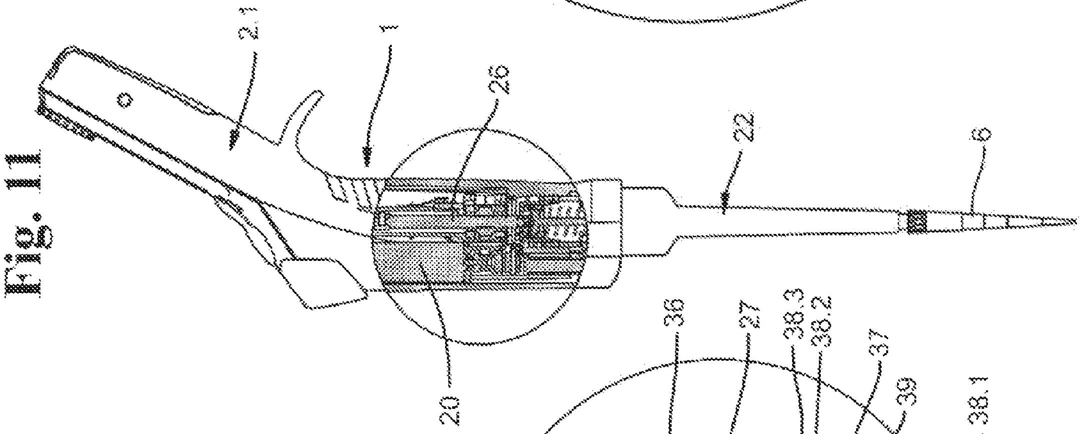
FIG. 11 the same metering apparatus with the drive in the upper position in a side view, wherein it is vertically cut in the region of the drive.
Figure 12A:
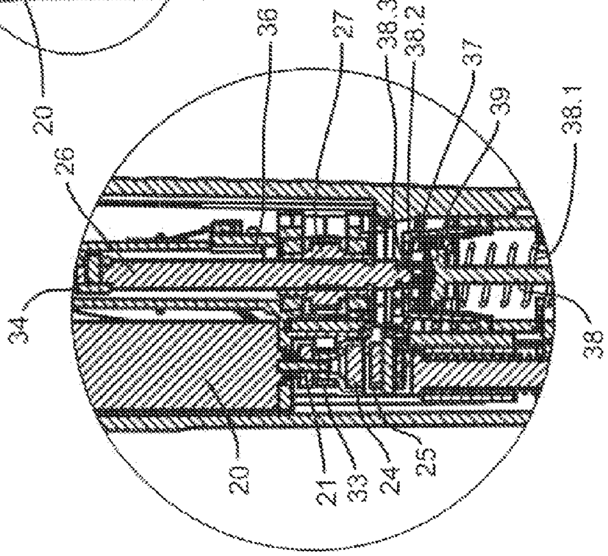
FIG. 12*a* magnified section XII of FIG. 11.
Figure 13:
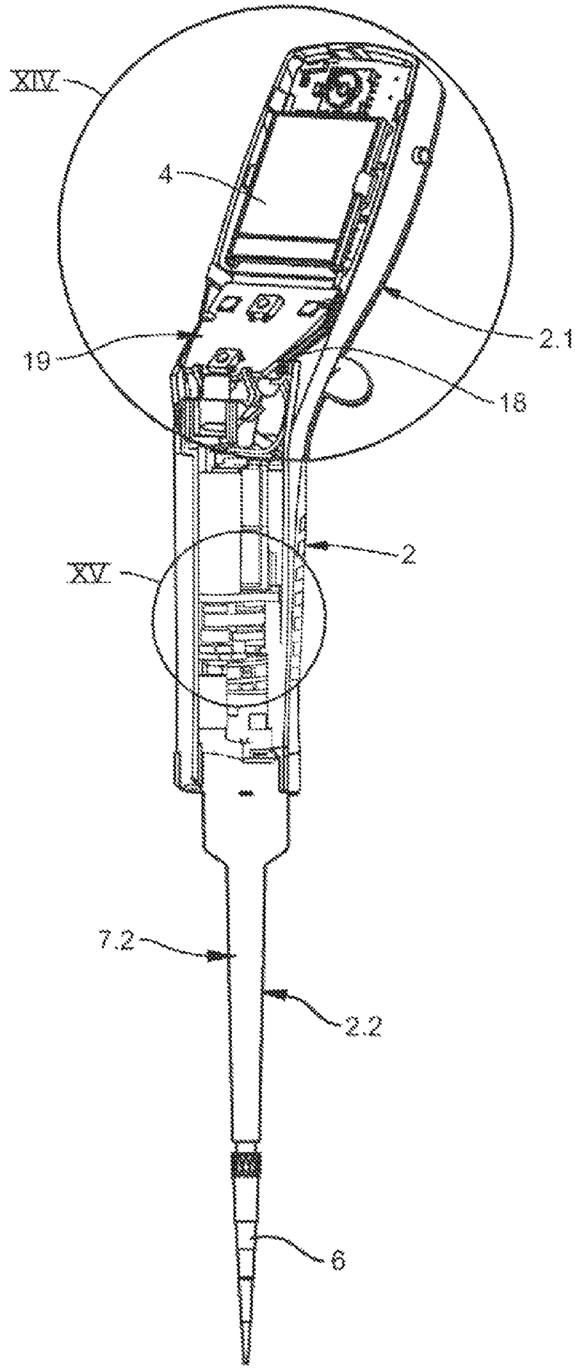
FIG. 13 the same metering apparatus with the drive in the working position with pinned-up pipette point, at partially opened casing in a perspective view skew from the side.
Figure 14:
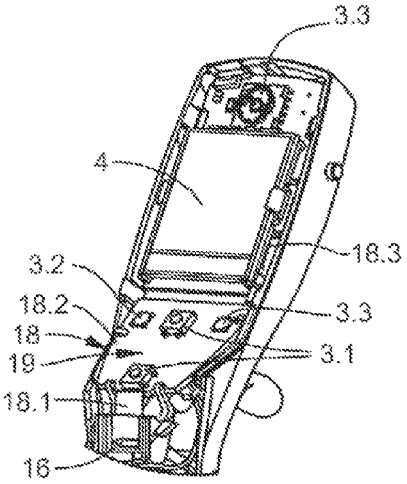
FIG. 14 detail XIV of FIG. 11.
Figure 15:
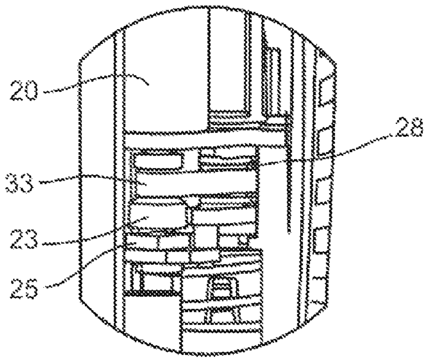
FIG. 15 magnified detail XV of FIG. 11.

Corresponding to a metering amount set by the input means 3, the electric control means control the displacement of the screw bar 26 about a certain path upward. As a consequence, the piston is moved upward in the displacement device 12, and liquid is aspirated into the pipette point 6. In FIGS. 11 and 12, the screw bar is shown in its uppermost position for the take-up of a certain amount of liquid.

The upward dislocation of the screw bar 26 from the base position in order to perform an aspiration stroke is controlled by actuating the switch rocker 3.1.

Figure 10:
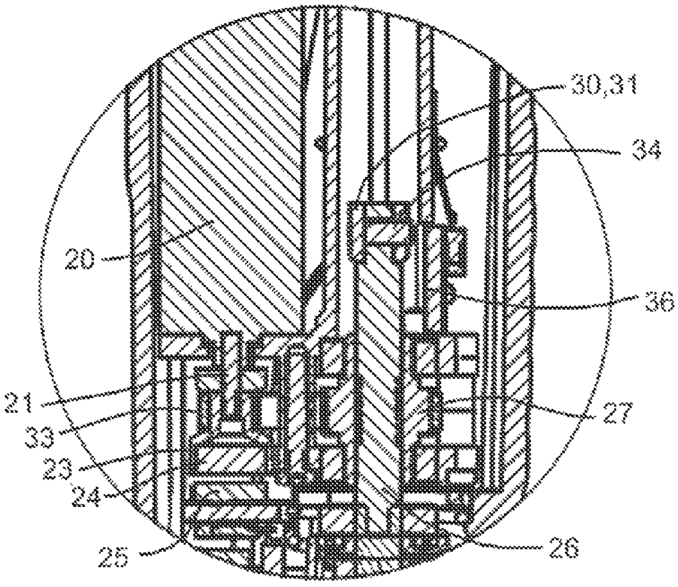
FIG. 10 magnified section IX according to FIG. 9.
Figure 9:
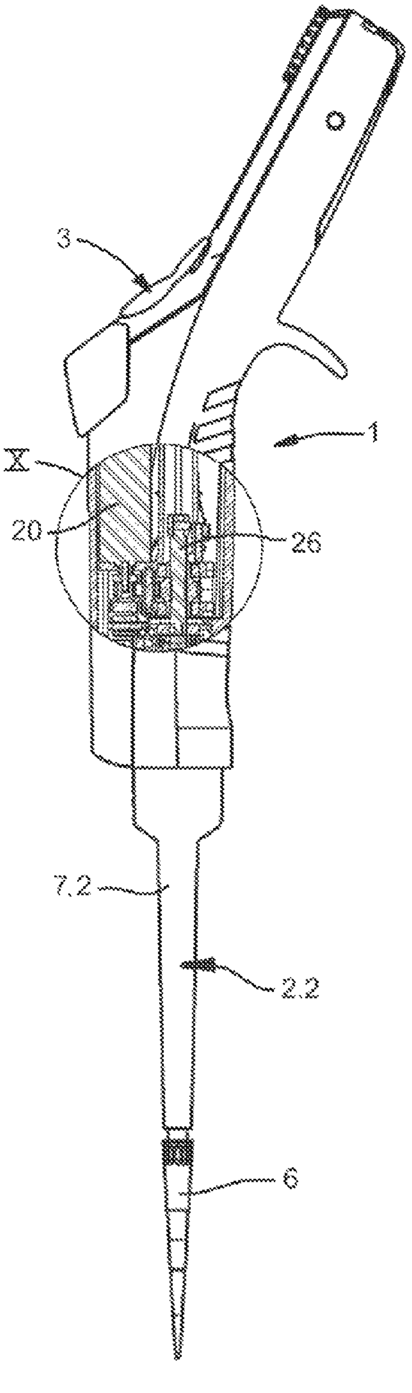
FIG. 9 the same metering apparatus with the drive in base position in a side view, wherein it is vertically cut in the region of the drive.

After the arrival in the uppermost position, by actuating the switch rocker 3.1 anew it is triggered that the electric control means 19 controls a dislocation of the screw bar 26 downward into the base position according to FIGS. 9 and 10. In this, liquid is delivered from the pipette point 6.

By actuating the switch rocker 3.1 anew, the execution of an overblow stroke is triggered. In this, the electric control means 19 dislocate the screw bar 26 rapidly downward over a stroke of 3 mm, so that residual liquid is pressed out of the pipette point 6.

Thereafter, the pipette point 6 can be thrown off by actuating the actuation member 7.4. After the actuation member 7.4 has passed a downward path of 3.1 mm, the sleeve-shaped slider part 7.2 contacts the upper edge of the pipette point 6 with its lower front side, and pushes the same off from the clamping seat 5. After the actuation member 7.4 had been moved downward for 4 mm altogether, the sensor 16 is actuated by the magnet 17. Through this, the electronic control means 19 receive a signal, which triggers that the electronic control means 19 control the drive motor such that the screw bar 26 arrives in the home position of FIGS. 7 and 8, and directly thereafter automatically in the base position of FIGS. 9 and 10.

After the relief of the actuation member 7.4, the metering apparatus 1 is ready for receiving another pipette point 6. The intake of another pipette point takes place by pinning up the clamping seat 5 into the upper opening of the pipette point 6.

This completes the description of the preferred and alternate embodiments of the invention. Those skilled in the art may recognize other equivalents to the specific embodiment described herein which equivalents are intended to be encompassed by the claims attached hereto.

What is claimed is:

1. A metering apparatus for liquids, with a base body (2), a pipette holder disposed on the base body (2) for holding at least one pipette point (6) in sealing connection with its upper opening to a passage opening (15) on the base body (2), and a displacement device (12) disposed in the base body (2) having a displacement chamber (13), a displacement member (14) movably disposed therein, and a communicating connection to the passage opening (15), or syringe holder disposed on the base body (2) for holding at least one syringe with a syringe cylinder in stationary relation to the base body, and with a syringe piston shiftable in the syringe cylinder and a coupler configured to be mechanically coupled to the syringe piston in the base body, a detachment device disposed on the base body (2) for detaching the pipette point (6) or syringe from the pipette holder, with a manually actuable actuation member (7.4) for actuating the detaching device without that the displacement member (14) or the coupler are moved, a sensor (16) disposed on the base body (2) for detecting an actuation of the detaching device or an occurred detachment of the pipette point or syringe, a controllable drive (20), which is operably connected to the displacement member (14) or the coupler, an input device for controlling the controllable drive (20), an electric control device, electrically connected to the controllable drive (20), the input device and the sensor (16) and the electric control means automatically configure the controllable drive (20) to dislocate the displacement member (14) or the coupler into a base position when the sensor (16) detects an actuation of the detachment device or the occurred detachment of the pipette point (16) or syringe.

2. The metering apparatus according to claim 1, wherein a dislocation of the displacement member (14) or of the coupler for taking up liquid into a pipette point (6) or syringe takes place from out the base position.

3. The metering apparatus according to claim 1, wherein the controllable drive (20) is an electric drive.

4. The metering apparatus according to claim 3, wherein the controllable drive (20) is an electric drive motor.

5. The metering apparatus according to claim 1, wherein the sensor (16) is a reed contact, configured to be actuated by the dislocation of a magnet (17) that is disposed on the detachment device.

6. The metering apparatus according to claim 5, wherein the magnet (17) is disposed on the actuation member (7.4), and/or the reed contact (16) is disposed on a circuit board (18) in the base body (2).

7. The metering apparatus according to claim 1, wherein the piptte holder feature at least one clamping seat (5) for a pipette point (6), and the detachment device a throw-off slider (7.1) configured to be dislocated with respect to the clamping seat and having one end for pushing off a pipette point (6) from the clamping seat (5), the actuation member (7.4) being connected to the other end of the throw-off slider (7.1).

8. The metering apparatus according to claim 1, wherein the electric control device is are made such that it dislocates the displacement member (14) into a home position when the sensor (16) detects an actuation of the means for detaching (7), from which home position the degree of a further dislocation of the displacement member is determined, and that they dislocate the displacement member (14) into the base position after the arrival in the home position.

9. The metering apparatus according to claim 8, wherein the electric control device is are made such that when the metering apparatus (1) is switched on, it controls a movement of the displacement member (14) into the home position and thereafter into the base position.

10. The metering apparatus according to claim 1, wherein a further sensor (36), disposed in the base body (2) and electrically connected to the electric control device, detects the arrival of the displacement member in the base- and/or home position.

11. The metering apparatus according to claim 10, wherein the further sensor (36) is a Hall sensor, which is actuated by a further magnet (34) connected to the displacement member, when the displacement member (14) arrives in the base- and/or home position.

12. A method for metering liquids by means of a metering apparatus (1) with a pipette holder at least one pipette point (6) and with a displacement device (12) having a displacement chamber (13) and a displacement member (14) disposed movably therein, or with a syringe holder for holding at least one syringe with a syringe cylinder and with a syringe piston movable therein and with a coupler configured to be coupled to the syringe piston, with a controllable drive (20), operably connected to the displacement member (14) or the coupler, and with a detaching device for detaching the pipette point (6) or syringe from the pipette holder and with electric control means electrically connected to the controllable drive and the sensor, wherein an actuation of the detaching device or the occurred detachment of the pipette point or syringe is detected by a sensor, and the displacement member (14) or the coupler is dislocated by the controllable drive into a base position after an actuation of the detaching device is detected by the sensor.

13. The method for metering liquids according to claim 12, wherein starting from the base position, the displacement member (14) or the coupler is dislocated in order to take up liquid into the pipette point (6) or the syringe.

14. The method for metering liquids according to claim 12 wherein the displacement member (14) or the coupler is dislocated into the base position when the metering apparatus (1) is switched on.

* * * * *

UNITED STATES PATENT AND TRADEMARK OFFICE

CERTIFICATE OF CORRECTION

PATENT NO. : 8,570,029 B2
APPLICATION NO. : 12/914581
DATED : October 29, 2013
INVENTOR(S) : Karl-Friedrich Andres, Peter Molitor and Peter Schmidt It is certified that error appears in the above-identified patent and that said Letters Patent is hereby corrected as shown below:

In the claims

Column 12, Line 13, delete "that-" after without

Column 12, Line 54, delete "are-" after is

Column 12, Line 62, delete "are-" after is

Signed and Sealed this
Twenty-eighth Day of January, 2014

Michelle K. Lee

Michelle K. Lee
*Deputy Director of the United States Patent and Trademark Office*